(12) United States Patent
Lee et al.

(10) Patent No.: US 10,707,254 B2
(45) Date of Patent: *Jul. 7, 2020

(54) SEMICONDUCTOR DEVICES

(71) Applicant: Samsung Electronics Co., Ltd., Suwon-si, Gyeonggi-do (KR)

(72) Inventors: Taeyon Lee, Seoul (KR); Gwideokryan Lee, Suwon-si (KR); Myungwon Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/152,625

(22) Filed: Oct. 5, 2018

(65) Prior Publication Data
US 2019/0043902 A1 Feb. 7, 2019

Related U.S. Application Data

(63) Continuation of application No. 15/499,333, filed on Apr. 27, 2017, now Pat. No. 10,134,792.

(30) Foreign Application Priority Data

Aug. 25, 2016 (KR) .................. 10-2016-0108534

(51) Int. Cl.
*H01L 27/146* (2006.01)

(52) U.S. Cl.
CPC ...... *H01L 27/1463* (2013.01); *H01L 27/1461* (2013.01); *H01L 27/14612* (2013.01); *H01L 27/14621* (2013.01); *H01L 27/14636* (2013.01); *H01L 27/14643* (2013.01); *H01L 27/14665* (2013.01); *H01L 27/14689* (2013.01)

(58) Field of Classification Search
None
See application file for complete search history.

(56) References Cited

U.S. PATENT DOCUMENTS

| | | |
|---|---|---|
| 7,397,100 B2 | 7/2008 | Jung |
| 7,492,027 B2 | 2/2009 | Mouli |
| 8,354,678 B1 | 1/2013 | Fox et al. |
| 8,664,578 B2 | 3/2014 | Hirigoyen et al. |
| 8,853,811 B2 | 10/2014 | Lai et al. |
| 9,054,007 B2 | 6/2015 | Hu et al. |
| 9,160,949 B2 | 10/2015 | Zhang et al. |
| 9,160,953 B2 | 10/2015 | Oishi |
| 9,305,947 B2 | 4/2016 | Ihara |
| 10,134,792 B2 * | 11/2018 | Lee .................. H01L 27/14612 |
| 2010/0133638 A1 | 6/2010 | Park et al. |
| 2014/0246707 A1 * | 9/2014 | Koo .................. H01L 27/14623 257/230 |

(Continued)

FOREIGN PATENT DOCUMENTS

JP  201538931  2/2015

*Primary Examiner* — Ali Naraghi
(74) *Attorney, Agent, or Firm* — Myers Bigel, P.A.

(57) ABSTRACT

Semiconductor devices are provided. The semiconductor devices may include a substrate, a device isolation pattern in the substrate to electrically isolate a first pixel and a second pixel from each other, a conductive pattern in the device isolation pattern, and a doping layer on a side surface of the device isolation pattern. The doping layer may have a conductivity type different from a conductivity type of the substrate.

16 Claims, 14 Drawing Sheets

(56) References Cited

U.S. PATENT DOCUMENTS

| | | |
|---|---|---|
| 2015/0091121 A1 | 4/2015 | Manda et al. |
| 2015/0155327 A1 | 6/2015 | Kuboi |
| 2015/0221692 A1 | 8/2015 | Enomoto et al. |
| 2015/0372036 A1 | 12/2015 | Suh et al. |
| 2016/0204156 A1 | 7/2016 | Togashi |
| 2017/0200757 A1* | 7/2017 | Ihara ................ H01L 27/14634 |
| 2017/0243915 A1* | 8/2017 | Chou ................ H01L 27/1463 |
| 2017/0287975 A1* | 10/2017 | Koo ................ H01L 27/1464 |

* cited by examiner

SEMICONDUCTOR DEVICES

CROSS-REFERENCE TO RELATED APPLICATION

This application is a continuation of U.S. patent application Ser. No. 15/499,333, filed Apr. 27, 2017, which itself claims priority under 35 U.S.C. § 119 to Korean Patent Application No. 10-2016-0108534, filed on Aug. 25, 2016, in the Korean Intellectual Property Office, the disclosures of both of which are hereby incorporated by reference in their entireties.

BACKGROUND

The present disclosure generally relates to a semiconductor device, and more particularly, to a device isolation pattern of a semiconductor device.

An image sensor is a semiconductor device configured to convert optical images into electrical signals. The image sensor may be classified into two types: a charge coupled device (CCD) type and a complementary metal-oxide-semiconductor (CMOS) type. In general, the CMOS-type image sensor may be called "CIS". The CIS may include a plurality of two-dimensionally arranged pixels, each of which includes a photodiode (PD) that converts incident light into an electrical signal.

SUMMARY

Some embodiments of the inventive concept provide a semiconductor device providing a high image quality.

According to some embodiments of the inventive concept, a semiconductor device may include a substrate, a device isolation pattern in the substrate to electrically isolate a first pixel and a second pixel from each other, a conductive pattern in the device isolation pattern, and a doping layer on a side surface of the device isolation pattern. The doping layer may have a conductivity type different from that of the substrate.

According to some embodiments of the inventive concept, a semiconductor device may include a substrate with a doped region, an insulating pattern in the doped region to electrically isolate a first pixel and a second pixel from each other, and a conductive via at least partially in the insulating pattern. The doped region and the substrate may form a pn junction.

According to some embodiments of the inventive concept, a semiconductor device may include a substrate of a first conductivity type, a device isolation pattern in the substrate, and a charge-trapping pattern on a side surface of the device isolation pattern. The charge-trapping pattern may include impurities having a second conductivity type that is different from the first conductivity type. The substrate may include a first surface and a second surface opposite the first surface, and the device isolation pattern may include a conductive pattern and an insulating pattern. The insulating pattern may be interposed between the conductive pattern and the charge-trapping pattern.

According to some embodiments of the inventive concept, an image sensor may include first and second photoelectric conversion regions in a substrate and a device isolation pattern between the first and second photoelectric conversion regions. The device isolation pattern may extend in a vertical direction that is perpendicular to a surface of the substrate, and the device isolation pattern may include a conductive pattern and an insulating pattern between the conductive pattern and the substrate. The image sensor may also include a doped region that is between the substrate and the device isolation pattern and directly contacts the insulating pattern, a first interconnection pattern that is on the substrate and is electrically connected to the doped region and a second interconnection pattern that is on the substrate and is electrically connected to the conductive pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Semiconductor devices according to some embodiments of the inventive concept will be described below. As used herein the term "and/or" includes any and all combinations of one or more of the associated listed items.

Figure 1:
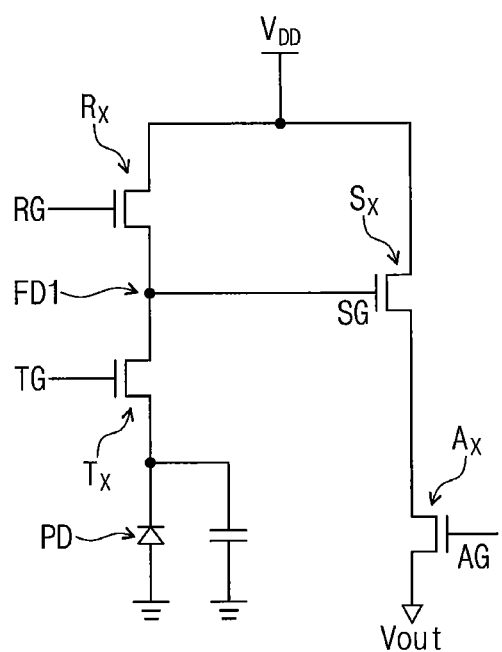
FIG. 1 is a circuit diagram of a pixel of a semiconductor device according to some embodiments of the inventive concept.

FIG. 1 is a circuit diagram of a pixel of a semiconductor device according to some embodiments of the inventive concept.

Referring to FIG. 1, a semiconductor device may include a plurality of pixels, each of which includes a photoelectric conversion region PD, a first transfer transistor Tx, a first source follower transistor Sx, a first reset transistor Rx, and a first selection transistor Ax. The first transfer transistor Tx, the first source follower transistor Sx, the first reset transistor Rx, and the first selection transistor Ax may include a first transfer gate TG, a first source follower gate SG, a first reset gate RG, and a first selection gate AG, respectively. That is, the semiconductor device may be an image sensor.

The photoelectric conversion region PD may be a photodiode including an n-type impurity region and a p-type impurity region. The semiconductor device may include a first floating diffusion region FD1 serving as a drain electrode of the first transfer transistor Tx. The first floating diffusion region FD1 may also serve as a source electrode of the first reset transistor Rx. The first floating diffusion region FD1 may be electrically connected to the first source follower gate SG of the first source follower transistor Sx. The first source follower transistor Sx may be connected to the first selection transistor Ax.

Hereinafter, an image sensing operation of the semiconductor device will be described with reference to FIG. 1. Firstly, in a light-blocking state, to discharge electric charges from the first floating diffusion region FD1, a power voltage $V_{DD}$ may be applied to drain electrodes of the first reset transistor Rx and the first source follower transistor Sx and the first reset transistor Rx may be turned on. Thereafter, if the first reset transistor Rx is turned-off and an external light is incident into the photoelectric conversion region PD, electron-hole pairs may be generated in the photoelectric conversion region PD. Holes may be moved toward and accumulated in the p-type impurity region of the photoelectric conversion region PD, and electrons may be moved toward and accumulated in the n-type impurity region of the photoelectric conversion region PD. If the first transfer transistor Tx is turned on, the electric charges (i.e., electrons and holes) may be transferred to and accumulated in the first floating diffusion region FD1. A change in amount of the accumulated electric charges may lead to a change in gate bias of the first source follower transistor Sx, and this may lead to a change in source potential of the first source follower transistor Sx. Accordingly, if the first selection transistor Ax is turned on, an amount of the electric charges may be read out as a signal to be transmitted through a column line.

Although the pixel of FIG. 1 is illustrated to have a single photoelectric conversion region PD and four transistors (i.e., Tx Rx, Ax, and Sx), the inventive concept may not be limited thereto. In some embodiments, a plurality of the pixels may be provided, and the first reset transistor Rx, the first source follower transistor Sx, or the first selection transistor Ax may be shared by adjacent ones of such pixels. In this case, it may be possible to increase an integration density of a semiconductor device.

Figure 2A:
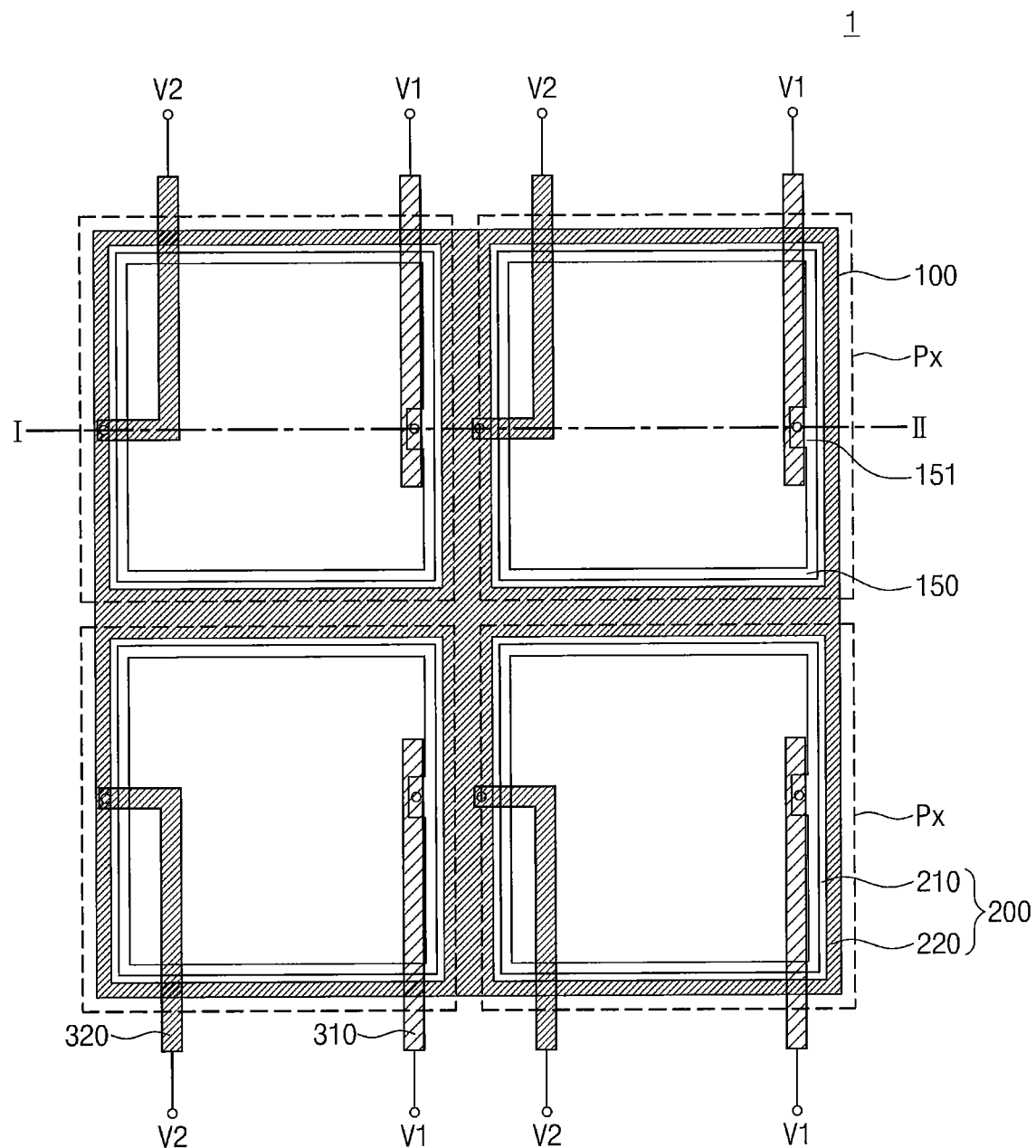
FIG. 2A is a plan view illustrating a semiconductor device according to some embodiments of the inventive concept.
Figure 2B:
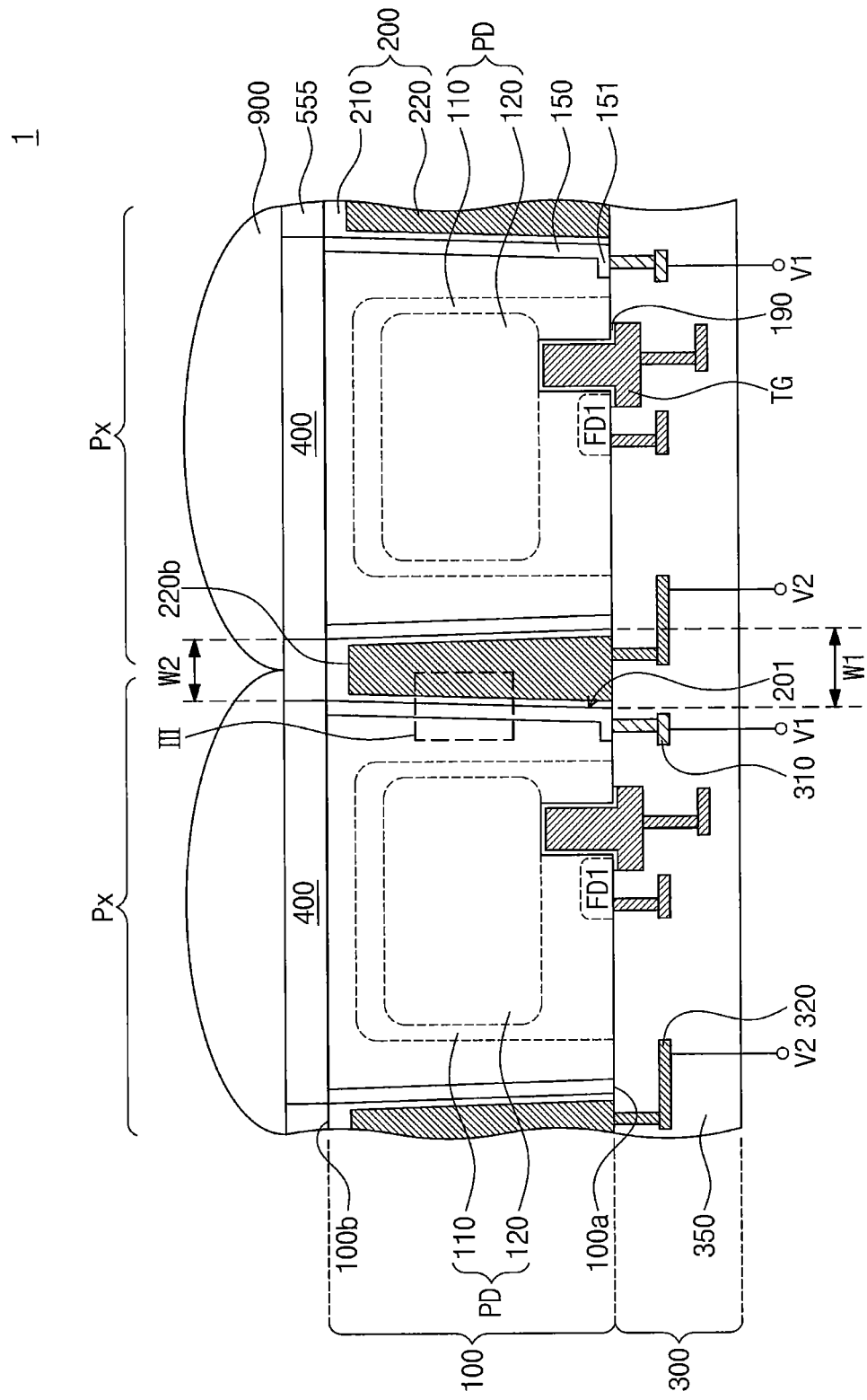
FIG. 2B is a sectional view taken along the line I-II of FIG. 2A.
Figure 2C:
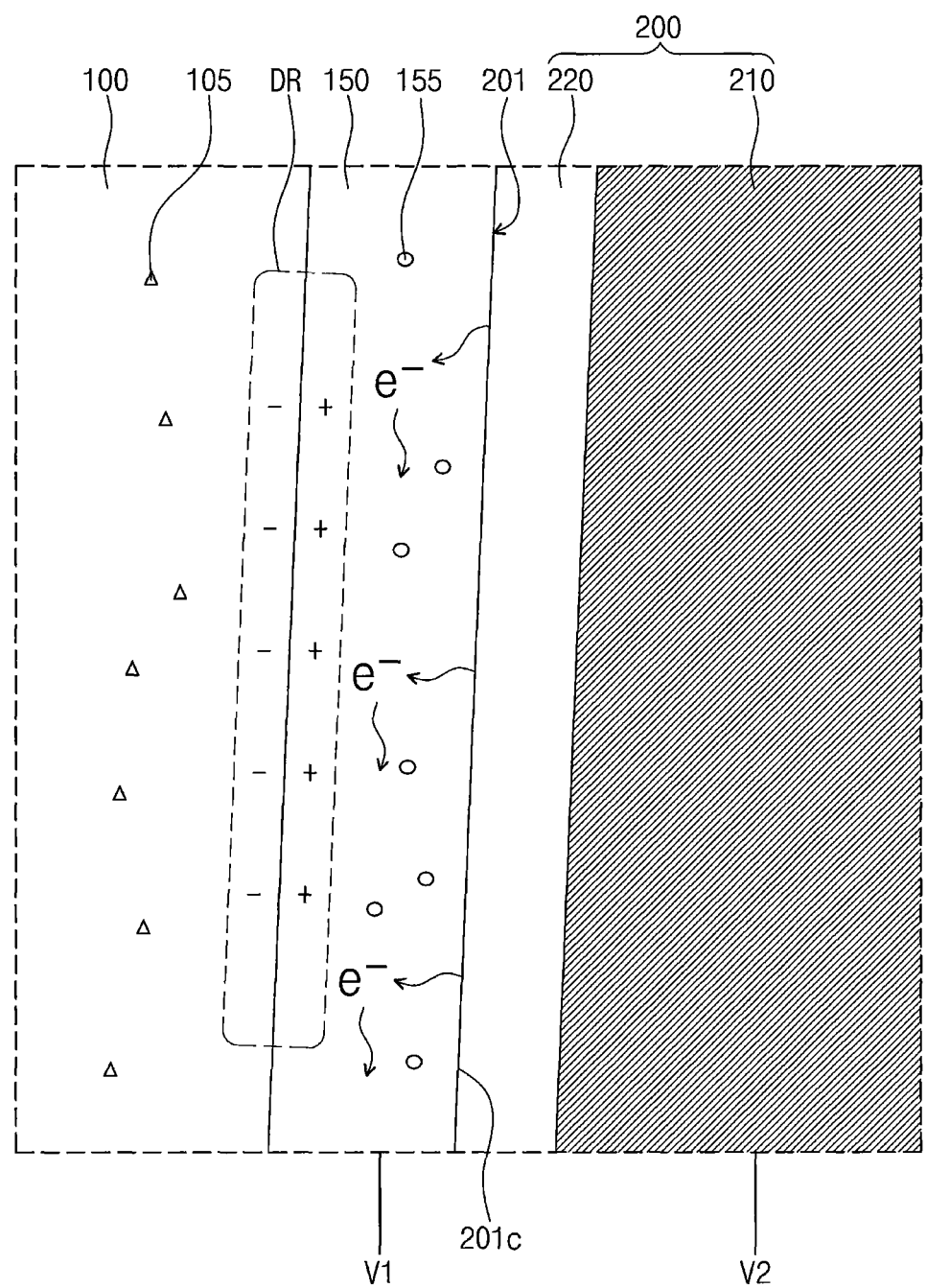
FIG. 2C is an enlarged sectional view of the region III of FIG. 2B.

FIG. 2A is a plan view illustrating a semiconductor device according to some embodiments of the inventive concept. FIG. 2B is a sectional view taken along the line I-II of FIG. 2A, and FIG. 2C is an enlarged sectional view of the region III of FIG. 2B. In the following description, a previously described element may be identified by a similar or identical reference number without repeating an overlapping description thereof, for the sake of brevity.

Referring to FIGS. 2A to 2C in conjunction with FIG. 1, a semiconductor device 1 may include a substrate 100, a device isolation pattern 200, and photoelectric conversion regions PD. The semiconductor device 1 may be an image sensor. The substrate 100 may include a plurality of pixels Px. The substrate 100 may include a first surface 100a and a second surface 100b that is opposite the first surface 100a. The first surface 100a of the substrate 100 may be a top surface, and the second surface 100b of the substrate 100 may be a bottom surface. The substrate 100 may be, for example, a semiconductor substrate (e.g., a silicon wafer, a germanium wafer, or a silicon-germanium wafer) or a silicon-on-insulator (SOI) substrate. The substrate 100 may contain impurities of a first conductivity type. The impurities of the first conductivity type may be, for example, p-type impurities (e.g., aluminum (Al), boron (B), indium (In) and/or gallium (Ga)).

The photoelectric conversion regions PD may be provided in the pixels Px of the substrate 100, respectively. Each of the photoelectric conversion regions PD may be configured to have the same function and role as the photoelectric conversion region PD of FIGS. 2A and 2B. Each of the photoelectric conversion regions PD may include a first impurity region 110 and a second impurity region 120. The first impurity region 110 may be spaced apart from the first surface 100a of the substrate 100. The first impurity region 110 may be a region that is formed in the substrate 100 and is doped with the impurities of the first conductivity type. The first impurity region 110 may serve as a well region. The second impurity region 120 may be provided in the first impurity region 110. The second impurity region 120 may be a region doped with impurities of a second conductivity type. The impurities of the second conductivity type may include n-type impurities (e.g., phosphorus, arsenic, bismuth, and/or antimony).

Each of the first transfer gates TG may be provided on the first surface 100a of the substrate 100 and on each of the pixels Px. The first transfer gates TG may be extended into the substrate 100. Gate insulating layers 190 may be respectively provided between the first transfer gates TG and the substrate 100.

The first floating diffusion region FD1 may be provided in the first impurity region 110. The first floating diffusion region FD1 may be provided at a side of a corresponding one of the first transfer gates TG. The first floating diffusion region FD1 may be a region doped with impurities, whose conductivity type is different from that of the first impurity region 110. For example, the first floating diffusion region FD1 may be doped with n-type impurities.

The device isolation pattern 200 may be provided in the substrate 100 to define the pixels Px. The device isolation pattern 200 may electrically isolate directly adjacent pixels from each other. It will be understood that first and second pixels are directly adjacent each other if there is no pixel between the first and second pixels. For example, the device isolation pattern 200 may be provided between the pixels Px of the substrate 100. The device isolation pattern 200 may be an insulating pattern filling a trench 201 recessed from the first surface 100a of the substrate 100 and may be formed by a deep trench isolation technology. In some embodiments, a width W1 of a bottom surface of the device isolation pattern 200 may be larger than a width W2 of a top surface of the device isolation pattern 200 as illustrated in FIG. 2B. Here, the bottom surface of the device isolation pattern 200 may be coplanar with the first surface 100a of the substrate 100 or may be closer to the first surface 100a of the substrate 100, compared to the top surface of the device isolation pattern 200. However, the device isolation pattern 200 may not be limited to the illustrated structure (e.g., a width and a planar shape) and may be variously changed. For example, the device isolation pattern 200 may be provided to fill the trench 201 that is formed by recessing the second surface 100b of the substrate 100.

The device isolation pattern 200 may include an insulating pattern 210 and a conductive pattern 220. The insulating pattern 210 may be provided along a side surface of the trench 201. The insulating pattern 210 may be formed of or include, for example, at least one of silicon-containing materials (e.g., silicon nitride, silicon oxide, and/or silicon oxynitride) and/or high-k dielectric materials (e.g., hafnium oxide and/or aluminum oxide). The insulating pattern 210 may have a refractive index lower than that of the substrate 100 or a doping layer 150. This may make it possible to prevent or suppress a cross-talk phenomenon from occurring between the pixels Px.

The conductive pattern 220 may be provided in the insulating pattern 210. The conductive pattern 220 may be a conductive via that is formed to penetrate at least a portion of the substrate 100. The conductive pattern 220 may have a top surface 220b that is provided in the insulating pattern 210 and is spaced apart from the second surface 100b of the substrate 100. The conductive pattern 220 may be formed of or include at least one of doped poly silicon or metals (e.g., tungsten or aluminum).

The doping layer 150 may be provided in the substrate 100 and on a side surface of the device isolation pattern 200. In some embodiments, the doping layer 150 may extend along the side surface of the device isolation pattern 200 as illustrated in FIG. 2B. In some embodiments, the doping layer 150 may directly contact the side surface of the device isolation pattern 200 as illustrated in FIG. 2B. The doping layer 150 may contain impurities whose conductivity type is different from that of the substrate 100. For example, the doping layer 150 may include impurities of the second conductivity type (e.g., n-type impurities). The doping layer 150 may include a protrusion 151. The protrusion 151 may be a portion of the substrate 100 that is positioned adjacent to the first surface 100a and is doped to have the second conductivity type. In some embodiments, the protrusion 151 may be connected to a portion of the doping layer 150 that is provided on the side surface of the device isolation pattern 200.

An interconnection layer 300 may be formed on the first surface 100a of the substrate 100. The interconnection layer 300 may include an insulating layer 350, a first interconnection pattern 310, and a second interconnection pattern 320. Although not shown, the insulating layer 350 may include a plurality of layers. The first interconnection pattern 310 may be provided on the first surface 100a of the substrate 100 and may be electrically connected to the doping layer 150. For example, the first interconnection pattern 310 may be in contact with the protrusion 151 of the doping layer 150. The first interconnection pattern 310 may include a metal layer and a contact plug. The first interconnection pattern 310 may be used to apply a first voltage V1 to the doping layer 150. In some embodiments, the first voltage V1 may be a positive voltage. In some embodiments, the first voltage V1 may be a ground voltage. In some embodiments, a plurality of the first interconnection pattern 310 and a plurality of the protrusion 151 may be provided. The protrusions 151 may be provided on the pixels Px, respectively, and the first interconnection patterns 310 may be coupled to the protrusions 151, respectively. The arrangements of the first interconnection pattern 310 and the protrusion 151 is not limited to that illustrated in FIG. 2A and is variously modified. Hereinafter, a single one of the first interconnection pattern 310 will be described.

The second interconnection pattern 320 may be provided on the first surface 100a of the substrate 100 and may be electrically connected to the conductive pattern 220. The second interconnection pattern 320 may be used to apply a second voltage V2 to the conductive pattern 220. The second voltage V2 may be a positive bias voltage. The insulating layer 350 may be provided to cover the first and second interconnection patterns 310 and 320.

Color filters 400 and micro lenses 900 may be provided on the second surface 100b of the substrate 100. The color filters 400 and the micro lenses 900 may be provided on the pixels Px, respectively. For example, each of the color filters 400 may include one of red, blue, and green filters. The use of the color filter 400 may allow light of a specific wavelength or color to be selectively incident into the photoelectric conversion region PD. A grid pattern 555 may be provided on the second surface 100b of the substrate 100 and between the color filters 400. The micro lenses 900 may be provided on the color filters 400.

FIGS. 3A, 3B, 3C and 3D are sectional views illustrating a method of fabricating a semiconductor device, according to some embodiments of the inventive concept. In the following description, a previously described element may be identified by a similar or identical reference number without repeating an overlapping description thereof, for the sake of brevity.

Figure 3A:
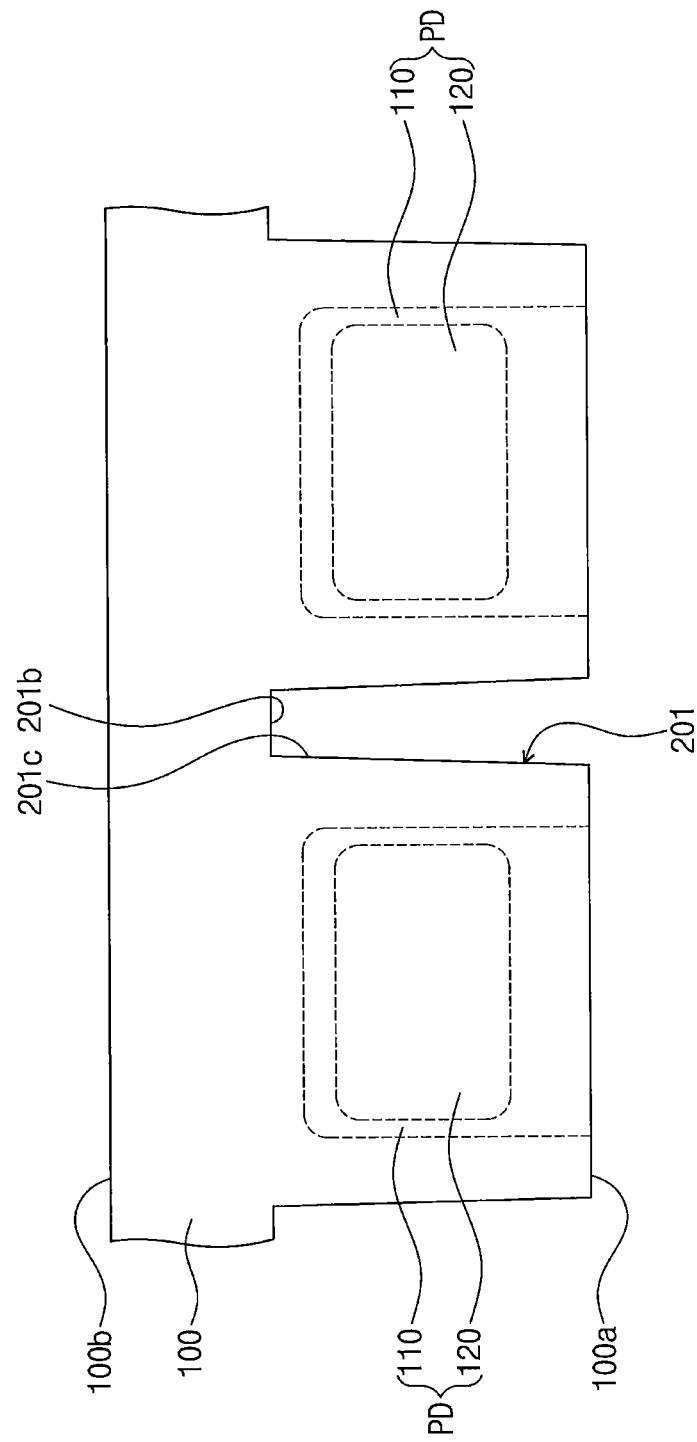
FIGS. 3A, 3B, 3C and 3D are sectional views illustrating a method of fabricating a semiconductor device, according to some embodiments of the inventive concept.

Referring to FIG. 3A, the substrate 100 may be prepared. The photoelectric conversion regions PD may be formed in the substrate 100. A mask layer (not shown) may be formed on the first surface 100a of the substrate 100. The substrate 100 exposed by the mask layer may be etched to form the trench 201 in the substrate 100. During the process of forming the trench 201, an etching stress may be applied to the substrate 100. As a result, interface defects (e.g., dangling bonds) may be formed on a side surface 201c and a bottom surface 201b of the trench 201.

Figure 3B:
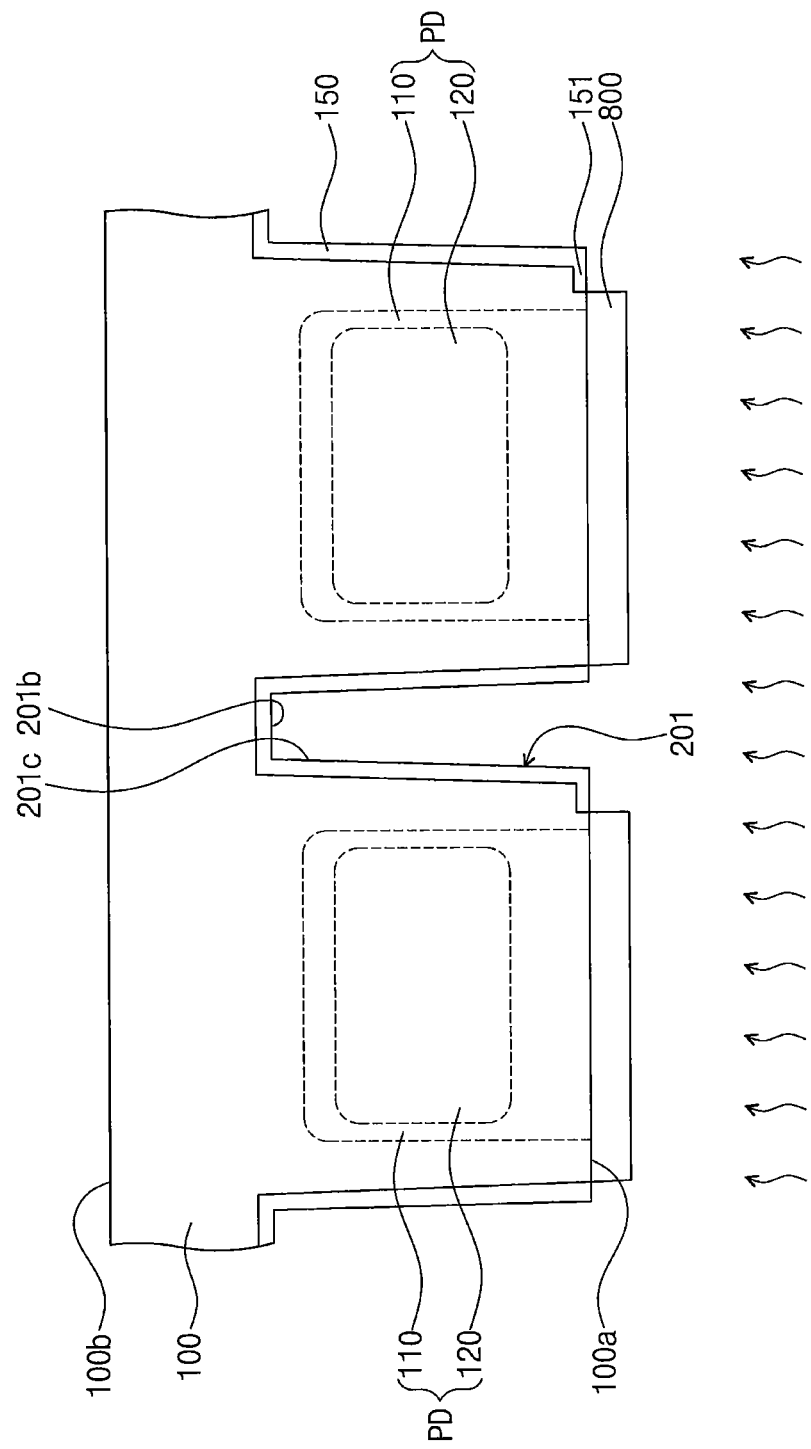

Referring to FIG. 3B, the doping layer 150 may be formed in the substrate 100. For example, the formation of the doping layer 150 may include forming a mask pattern 800 on the first surface 100a of the substrate 100 and injecting impurities of the second conductivity type into the substrate 100 through the trench 201 exposed by the mask pattern 800. The impurities of the second conductivity type may be injected into the substrate 100 through the side and bottom surfaces 201c and 201b of the trench 201. Here, the impurities of the second conductivity type may be injected into a portion of the substrate 100 through the first surface 100a adjacent to the trench 201, thereby forming the protrusion 151. Thereafter, the mask pattern 800 may be removed.

Figure 3C:
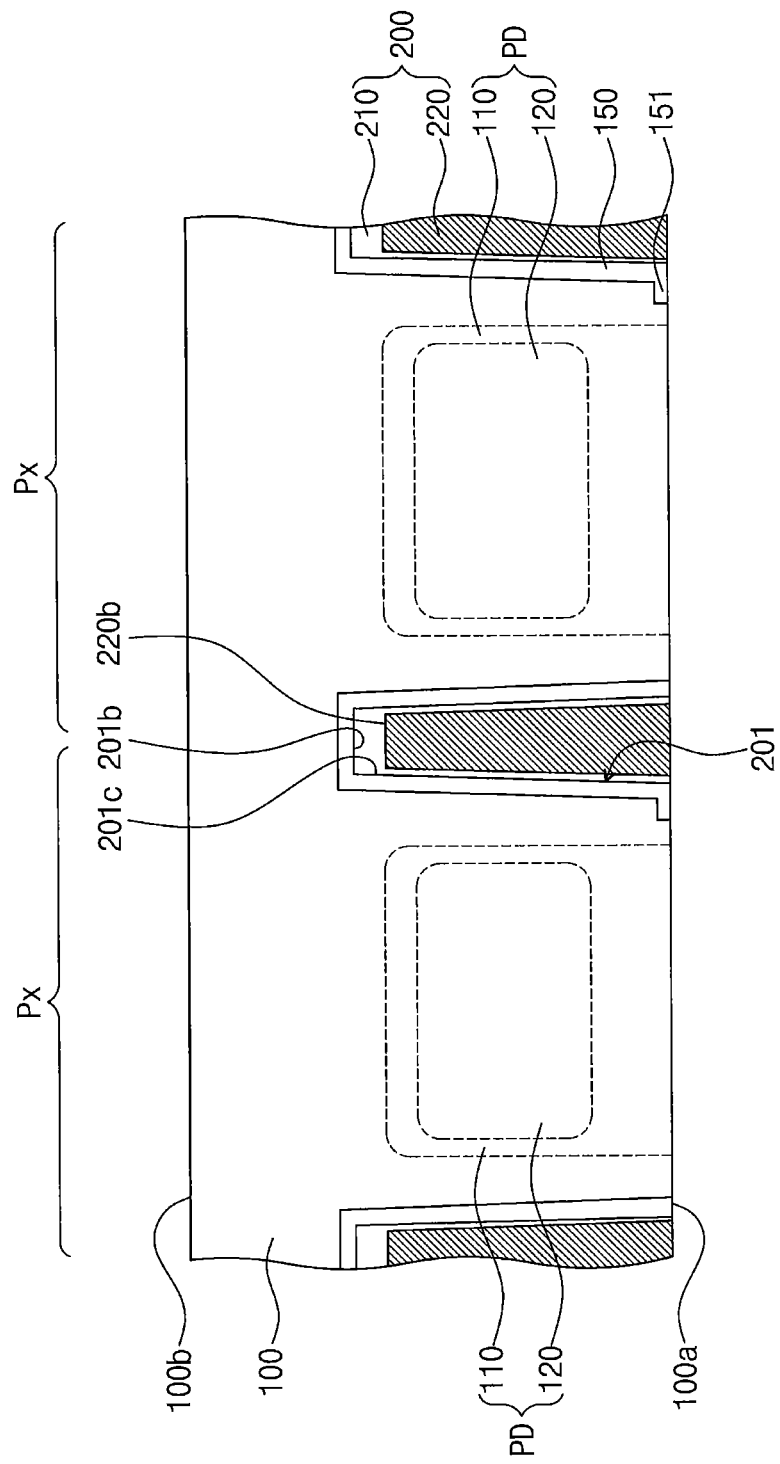

Referring to FIG. 3C, the insulating and conductive patterns 210 and 220 constituting the device isolation pattern 200 may be formed in the trench 201. The insulating pattern 210 may be formed on the doping layer 150. The insulating pattern 210 may extend along the side and bottom surfaces 201c and 201b of the trench 201. The conductive pattern 220 may be formed to penetrate at least a portion of the insulating pattern 210. The top surface 220b of the conductive pattern 220 may be provided in the insulating pattern 210. However, the position of the top surface 220b of the conductive pattern 220 may not be limited thereto. For example, the top surface 220b of the conductive pattern 220 may be provided in the doping layer 150 or the substrate 100. The device isolation pattern 200 may be used to define the pixels Px in the substrate 100.

Figure 3D:
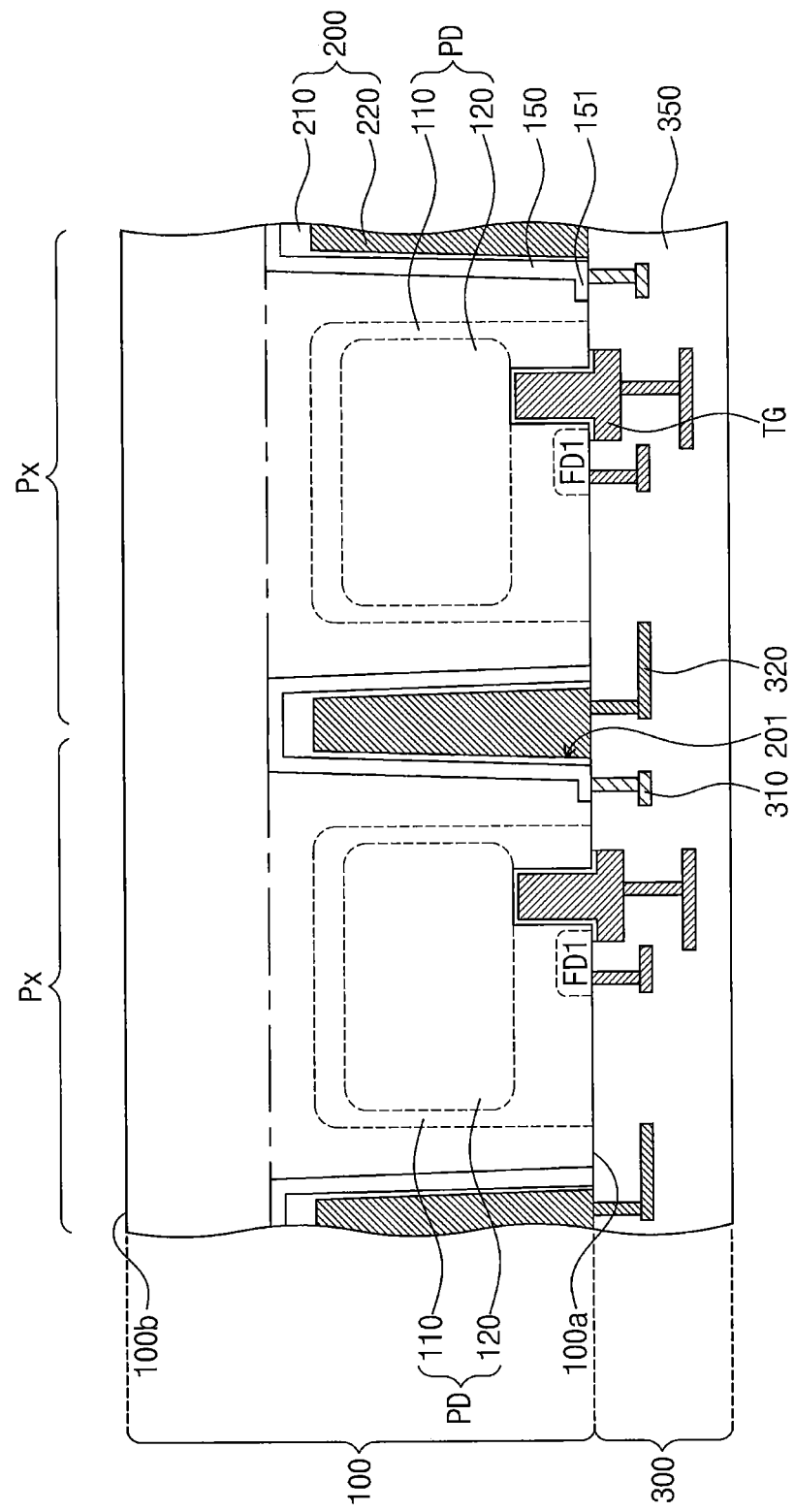

Referring to FIG. 3D, the first floating diffusion region FD1 may be formed in the substrate 100. The first transfer gates TG and the interconnection layer 300 may be formed on the first surface 100a of the substrate 100. Thereafter, a chemical mechanical polishing (CMP) or grinding process may be performed on the second surface 100b of the substrate 100 to thin the substrate 100. The thinning of the substrate 100 may be performed to expose the insulating pattern 210, as illustrated by an alternated long and short dash line.

Referring back to FIG. 2B, the color filters 400, the grid pattern 555, and the micro lenses 900 may be formed on the second surface 100b of the substrate 100. According to some embodiments of the inventive concept, the method of fabricating the semiconductor device 1 may not be limited to that described with reference to FIGS. 3A to 3D. For example, in some embodiments, the trench 201 may be formed by etching the second surface 100b of the substrate 100. In this case, the photoelectric conversion regions PD, the first floating diffusion region FD1, the first transfer gates TG, and the interconnection layer 300 may be formed in advance before the trench 201 is formed. Hereinafter, the device isolation pattern 200 and the doping layer 150 will be described in more detail.

Referring to FIGS. 2B and 2C, light may be incident into the substrate 100 through the second surface 100b. The photoelectric conversion regions PD may generate electron-hole pairs when the photoelectric conversion regions PD is exposed to the incident light, and electrons or holes generated in this process may be used as an electrical signal. During the etching process of the substrate 100 described with reference to FIG. 3A, interface defects may be produced at the side surface 201c of the trench 201. Electrons may also be generated by the interface defects of the trench 201 as well as the incident light. If electrons (e) generated by the interface defects are transferred to the photoelectric conversion regions PD through the doping layer 150 and the substrate 100, the pixels Px may output not only a photoelectric signal but also a noise signal. Here, the photoelectric signal may refer to an electrical signal produced by the incident light, and the noise signal may refer to an electrical signal produced by the interface defect. Hereinafter, for concise description, electrons (e$^-$), which are generated by the interface defects at the side surface 201c of the trench 201, will be referred to as noise electrons. In some embodiments, the interface defect of the trench 201 may include interface defects between the doping layer 150 and the insulating pattern 210 of the device isolation pattern 200.

The doping layer 150 may be formed to have a conductivity type different from that of the substrate 100, and thus, the doping layer 150 and the substrate 100 may form a pn junction. The pn junction may include a depletion region DR that is formed in the doping layer 150 and the substrate 100, as shown in FIG. 2C. For example, in the pn junction, the depletion region DR may be a region that is formed near a junction interface, as a result of recombination of holes and electrons. As an example, the doping layer 150 may be of an n-type and the substrate 100 may be of a p-type. In this case, as a result of diffusion and recombination of electrons 155 of the doping layer 150 and holes 105 of the substrate 100, the depletion region DR serving as a potential barrier may be formed near a junction interface between the doping layer 150 and the substrate 100.

Owing to the depletion region DR serving as the potential barrier, it may be difficult for the electrons (i.e., noise electrons e$^-$) generated by the interface defects to move from the doping layer 150 to the substrate 100. Thus, the noise electrons e$^-$ may be trapped in the doping layer 150. When the semiconductor device 1 is operated, the second voltage V2 may be applied to the conductive pattern 220 through the second interconnection pattern 320. In the case where the second voltage V2 is a positive bias voltage, a potential difference in the depletion region DR may be increased. This may lead to a reduction in the number of the noise electrons e$^-$ passing through the depletion region DR (that is, an increase in the number of the noise electrons e$^-$ to be trapped in the doping layer 150). The first interconnection pattern 310 may be used to apply the first voltage V1 to the doping layer 150, and here, the first voltage V1 may be a positive voltage. The noise electrons e$^-$ trapped in the doping layer 150 may be exhausted to the outside through the first interconnection pattern 310. Accordingly, it may be possible to prevent or suppress the noise electrons e$^-$ from being moved into the photoelectric conversion regions PD and consequently to improve an image quality of the semiconductor device 1.

Figure 4:
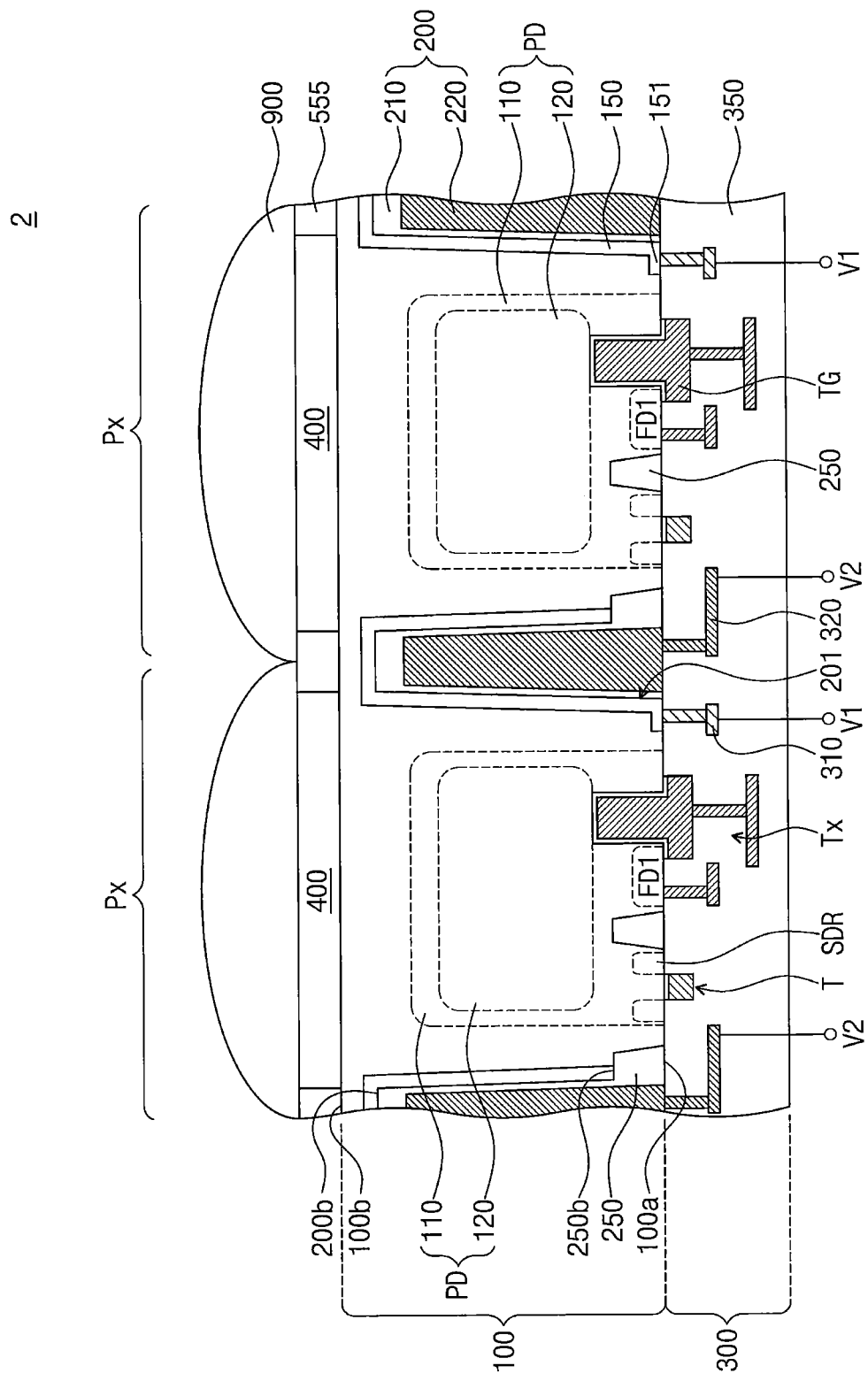
FIG. 4 is a sectional view illustrating a semiconductor device according to some embodiments of the inventive concept.

FIG. 4 is a sectional view illustrating a semiconductor device according to some embodiments of the inventive concept. FIG. 4 is a sectional view taken along the line I-II of FIG. 2A. In the following description, a previously described element may be identified by a similar or identical reference number without repeating an overlapping description thereof, for the sake of brevity.

Referring to FIG. 4 in conjunction with FIG. 2A, a semiconductor device 2 may include a device insulating pattern 250, in addition to the substrate 100, the device isolation pattern 200, the photoelectric conversion regions PD, the doping layer 150, and the interconnection layer 300.

The device isolation pattern 200 may have a top surface 200b that is spaced apart from the second surface 100b of the substrate 100. For example, the polishing or grinding process of FIG. 3D may be performed in such a way that the device isolation pattern 200 is not exposed. The doping layer 150 may be provided on the side surface of the device isolation pattern 200. The doping layer 150 may include a portion covering the top surface 200b of the device isolation pattern 200.

The device insulating pattern 250 may be provided in the substrate 100. The device insulating pattern 250 may be formed by a shallow trench isolation (STI) technology and may have a thickness smaller than that of the device isolation pattern 200. The device insulating pattern 250 may have a top surface 250b that is positioned at a level different from that of the top surface 200b of the device isolation pattern 200. For example, the top surface 250b of the device insulating pattern 250 may be closer to the first surface 100a of the substrate 100 than the top surface 200b of the device isolation pattern 200 is. In some embodiments, the device insulating pattern 250 may have a first length in a direction that is perpendicular to the first surface 100a of the substrate 100, the device isolation pattern 200 has a second length in the direction, and the first length is less than the second length as illustrated in FIG. 4. In some embodiments, the device insulating pattern 250 and the device isolation pattern 200 may form a stepwise structure as illustrated in FIG. 4. For example, the device insulating pattern 250 may be provided on the side surface of the device isolation pattern 200 and may include a portion that extends from the device isolation pattern 200 in a lateral direction parallel to the first surface 100a. As an example, the device insulating pattern 250 may be formed of or include the same material as that of the insulating pattern 210 and may be physically connected to the insulating pattern 210. The device insulating pattern 250 may be provided to define active regions. For example, each of the first transfer transistor Tx and a read-out device T may include the active region defined by the device insulating pattern 250, and each of the first floating diffusion region FD1 and source/drain regions SDR of the read-out device T may be a part of the active region. Here, the read-out device T may include at least one of the first source follower transistor Sx, the first reset transistor Rx, or the first selection transistor Ax of FIG. 1. In some embodiments, the doping layer 150 may not be provided on the side surface and the top surface 250b of the device insulating pattern 250. In some embodiments, the doping layer 150 may further include a portion provided between the device insulating pattern 250 and the substrate 100.

Figure 5:
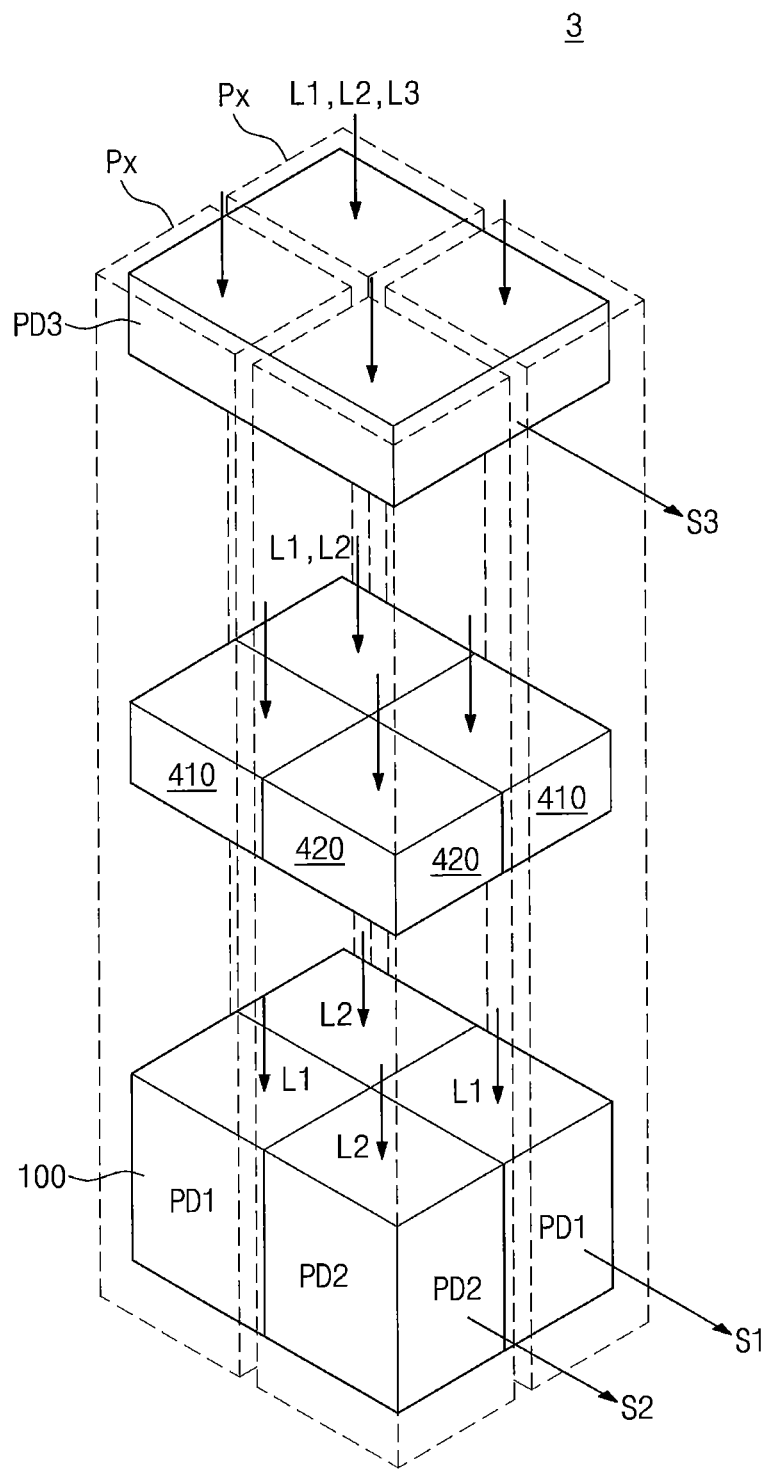
FIG. 5 is a block diagram illustrating a semiconductor device according to some embodiments of the inventive concept.

FIG. 5 is a block diagram illustrating a semiconductor device according to some embodiments of the inventive concept. In the following description, a previously described element may be identified by a similar or identical reference number without repeating an overlapping description thereof, for the sake of brevity.

Referring to FIG. 5, a semiconductor device 3 may include photoelectric conversion regions PD1 and PD2, color filters 410 and 420, and a photoelectric conversion layer PD3. The photoelectric conversion layer PD3 may be provided on the substrate 100. First to third lights L1, L2, and L3, which have first to third wavelengths, respectively, may be incident into the photoelectric conversion layer PD3. The first and second wavelengths may be different from the third wavelength. The first wavelength may be different from the second wavelength. For example, the first light L1 may be a red light, the second light L2 may be a blue light, and the third light L3 may be a green light.

The photoelectric conversion layer PD3 may be configured to generate a third photoelectric signal S3 from the third light L3. The photoelectric conversion layer PD3 may generate a third photoelectric signal S3 corresponding to the third light L3. The photoelectric conversion layer PD3 may be configured to allow the first light L1 and the second light L2 to pass therethrough. When viewed in a plan view, the photoelectric conversion layer PD3 may be overlapped with the photoelectric conversion regions PD1 and PD2. It will be understood that "an element A overlaps an element B in a plan view" (or similar phrase) means that at least one vertical line exists that intersects both the elements A and B.

The first and second lights L1 and L2 passing through the photoelectric conversion layer PD3 may be incident into the color filters 410 and 420. The color filters 410 and 420 may include a first color filter 410 and a second color filter 420. One of the first and second color filters 410 and 420 may be provided on each of the photoelectric conversion regions PD1 and PD2. The first color filter 410 may be configured to allow the first light L1 to pass therethrough and to prevent the second light L2 from passing therethrough. The second color filter 420 may be configured to allow the second light L2 to pass therethrough and to prevent the first light L1 from passing therethrough.

The photoelectric conversion regions PD1 and PD2 may be provided in the pixels Px of the substrate 100. The photoelectric conversion regions PD may include a first photoelectric conversion region PD1 and a second photoelectric conversion region PD2. The first photoelectric conversion region PD1 may be provided on a bottom surface of the first color filter 410, and the second photoelectric conversion region PD2 may be provided on a bottom surface of the second color filter 420. The first color filter 410 may be configured to allow the first light L1 to be incident into the first photoelectric conversion region PD1. In the first photoelectric conversion region PD1, the first light L1 may produce a first photoelectric signal S1. In the second photoelectric conversion region PD2, the second light L2 may produce a second photoelectric signal S2. In some embodiments, the photoelectric conversion layer PD3 may be stacked on the photoelectric conversion regions PD1 and PD2, and this may make it possible to reduce a size of the semiconductor device 3.

The first and second photoelectric conversion regions PD1 and PD2 may be operated in the same manner as that of the photoelectric conversion region PD described with reference to FIG. 1. Hereinafter, an operation of the photoelectric conversion layer PD3 will be described with reference to FIG. 6.

Figure 6:
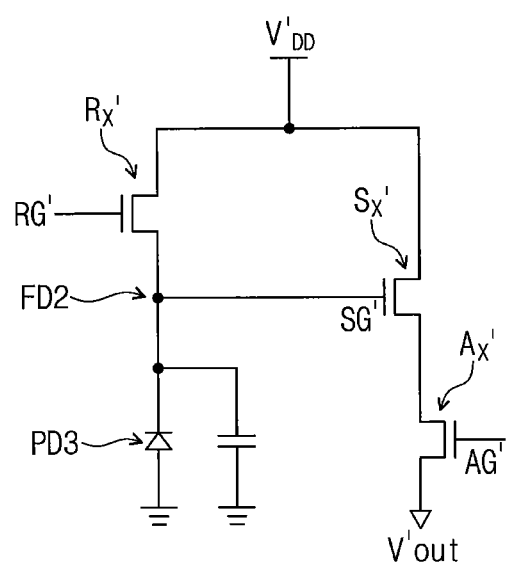
FIG. 6 is a circuit diagram of a pixel of a semiconductor device according to some embodiments of the inventive concept.

FIG. 6 is a circuit diagram of a pixel of a semiconductor device according to some embodiments of the inventive concept.

Referring to FIG. 6, a second source follower transistor Sx', a second reset transistor Rx', and a second selection transistor Ax', in addition to the first transfer transistor Tx, the first source follower transistor Sx, the first reset transistor Rx, and the first selection transistor Ax of FIG. 1 are provided on each of pixels a semiconductor device. The second source follower transistor Sx', the second reset transistor Rx', and the second selection transistor Ax' may include a second source follower gate SG', a second reset gate RG', and a second selection gate AG', respectively. Unlike that of FIG. 1, a transfer gate may not be provided between the photoelectric conversion layer PD3 and a second floating diffusion region FD2.

Photocharges generated in the photoelectric conversion layer PD3 may be transferred to the second floating diffusion region FD2. The second source follower transistor Sx', the second reset transistor Rx', and the second selection transistor Ax' may be configured to have substantially the same features (e.g., in terms of their operation methods and roles) as those of the first source follower transistor Sx, the first reset transistor Rx, and the first selection transistor Ax of FIG. 1. In some embodiments, the second source follower transistor Sx', the second reset transistor Rx', and the second selection transistor Ax' may be designed and provided to perform operations that are independent of the first transfer transistor Tx, the first source follower transistor Sx, the first reset transistor Rx, and the first selection transistor Ax. In some embodiments, the photoelectric conversion layer PD3 may be configured to share the first source follower transistor Sx, the first reset transistor Rx, or the first selection transistor Ax on the photoelectric conversion region PD of FIG. 1. In this case, it may be possible to omit the second source follower transistor Sx', the second reset transistor Rx', or the second selection transistor Ax' for such a sharing.

Figure 7A:
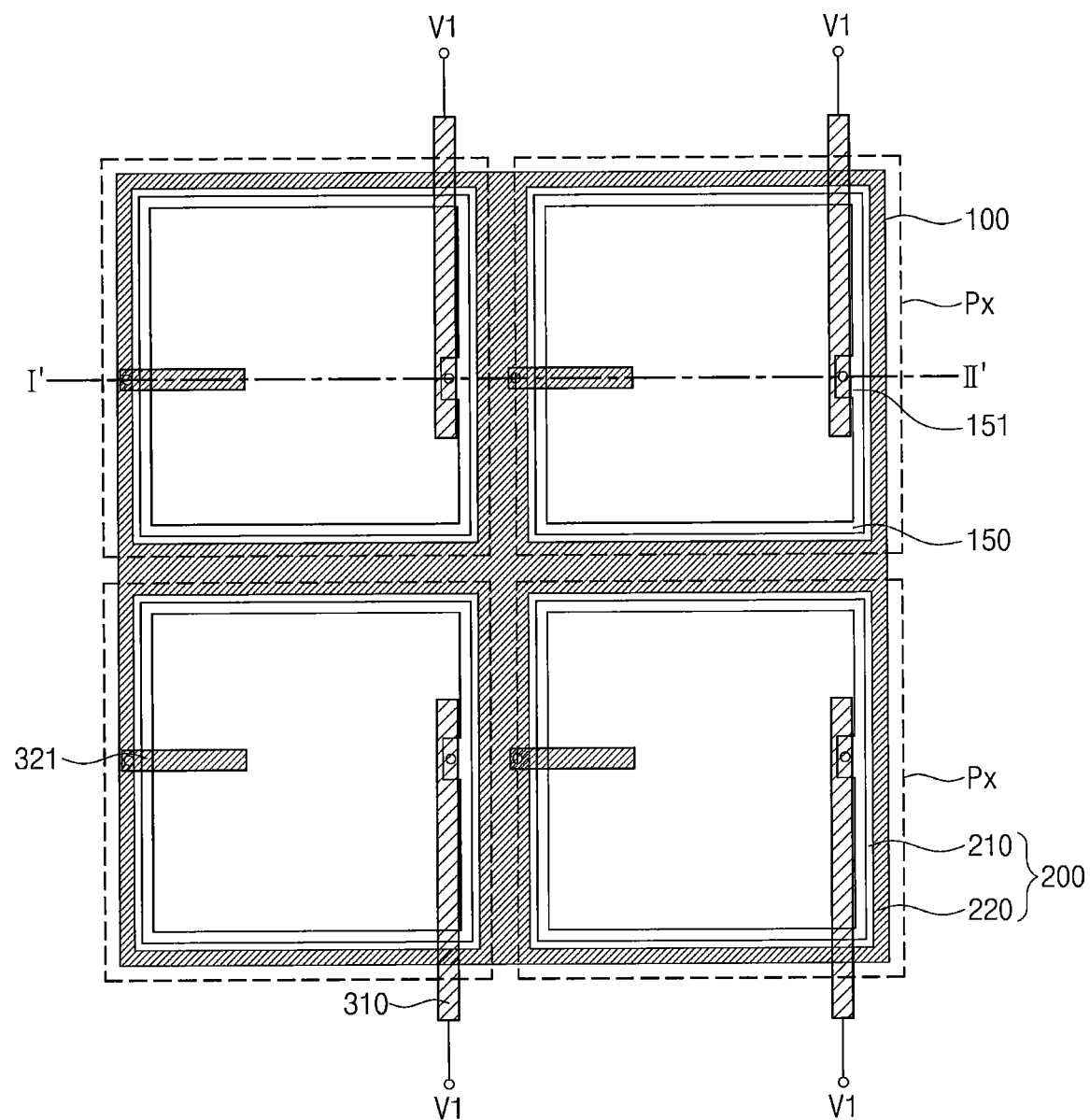
FIG. 7A is a plan view illustrating a semiconductor device according to some embodiments of the inventive concept.
Figure 7B:
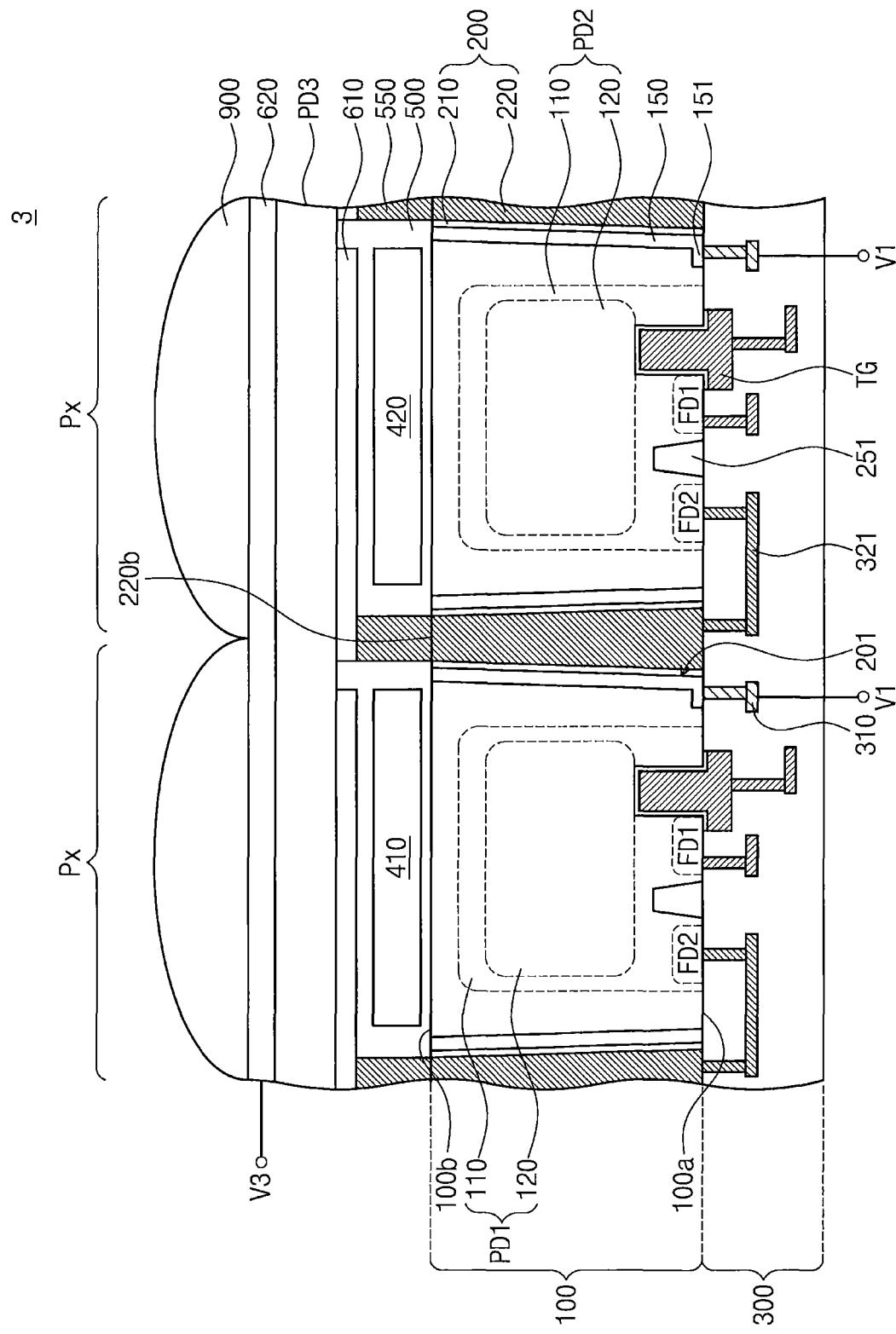
FIG. 7B is a sectional view taken along the line of FIG. 7A.

FIG. 7A is a plan view illustrating a semiconductor device according to some embodiments of the inventive concept. FIG. 7B is a sectional view taken along the line I'-II' of FIG. 7A. In the following description, a previously described element may be identified by a similar or identical reference number without repeating an overlapping description thereof, for the sake of brevity.

Referring to FIGS. 7A and 7B in conjunction with FIGS. 5 and 6, the semiconductor device 3 may include the photoelectric conversion layer PD3, in addition to the substrate 100, the device isolation pattern 200, the doping layer 150, the photoelectric conversion regions PD1 and PD2, and the interconnection layer 300. The substrate 100, the device isolation pattern 200, and the doping layer 150 may be provided to have substantially the same features as those of FIGS. 2A to 2C. For example, the doping layer 150 may be provided between the substrate 100 and the device isolation pattern 200 and may contain impurities of the second conductivity type. The first interconnection pattern 310 may be used to apply the first voltage V1 to the doping layer 150. The insulating pattern 210 may be interposed between the conductive pattern 220 and the substrate 100. The conductive pattern 220 may be provided to penetrate the insulating pattern 210. The top surface 220b of the conductive pattern 220 may be coplanar with the second surface 100b of the substrate 100.

The photoelectric conversion regions PD1 and PD2 may be provided in the substrate 100. The first and second photoelectric conversion regions PD1 and PD2 may be configured to have substantially the same features (e.g., in terms of their operation methods and roles) as those of the photoelectric conversion region PD of FIG. 1. The first photoelectric conversion region PD1 may include the first and second impurity regions 110 and 120. The second photoelectric conversion region PD2 may include the first and second impurity regions 110 and 120. At least one of the first photoelectric conversion region PD1 and the second photoelectric conversion region PD2 may be provided in each of the pixels Px. A protection layer 500 may be provided on the second surface 100b of the substrate 100. The protection layer 500 may be formed of or include an insulating material (e.g., silicon oxide). The color filters 410 and 420 may be provided in the protection layer 500. The first color filter 410 and the second color filter 420 may be provided on the first photoelectric conversion region PD1 and the second photoelectric conversion region PD2, respectively. As described with reference to FIG. 5, the first color filter 410 may be configured to allow the first light L1 to pass therethrough. The first photoelectric conversion region PD1 may be configured to produce the first photoelectric signal S1 from the first light L1. The second color filter 420 may be configured to allow the second light L2 to pass therethrough. The second photoelectric conversion region PD2 may be configured to produce the second photoelectric signal S2.

A lower electrode pattern 610 may be provided in the protection layer 500 and on the color filters 410 and 420. The lower electrode pattern 610 may be formed of or include a transparent conductive oxide. A connecting portion 550 may be interposed between the conductive pattern 220 and the lower electrode pattern 610. The connecting portion 550 may be electrically connected to the conductive pattern 220 and the lower electrode pattern 610. The connecting portion 550 may be formed of or include a conductive material (e.g., at least one of metals).

The photoelectric conversion layer PD3 may be provided on the lower electrode pattern 610. The photoelectric conversion layer PD3 may be configured to have substantially the same features (e.g., in terms of their operation methods and roles) as those of the photoelectric conversion layer PD3 described with reference to FIG. 6. The photoelectric conversion layer PD3 may include an organic photoelectric conversion layer. The photoelectric conversion layer PD3 may include a p-type organic semiconductor material and an n-type organic semiconductor material, which are provided to constitute a pn junction. In some embodiments, the photoelectric conversion layer PD3 may include a quantum dot or a chalcogenide material. The photoelectric conversion layer PD3 may be configured to absorb the third light L3 and then to generate electron-hole pairs from the third light L3, as described with reference to FIG. 5. Accordingly, there may be no need to provide an additional color filter on the photoelectric conversion layer PD3.

An upper electrode pattern 620 may be provided on the photoelectric conversion layer PD3. The upper electrode pattern 620 may be formed of or include a transparent conductive oxide. The upper electrode pattern 620 may be applied with a third voltage V3. The third voltage V3 may be a positive bias voltage. In some embodiments, the third voltage V3 may be an operation voltage that is used to operate the photoelectric conversion layer PD3. If the third voltage V3 is applied to the upper electrode pattern 620, electrons or holes formed in the photoelectric conversion layer PD3 may be transferred to the conductive pattern 220 through the lower electrode pattern 610 and the connecting portion 550. The second interconnection pattern 321 may be provided on the first surface 100a of the substrate 100 and may be electrically connected to the conductive pattern 220 and the second floating diffusion region FD2. The electrons or holes transferred to the conductive pattern 220 may be transferred to the second floating diffusion region FD2 through the second interconnection pattern 321. The conductive pattern 220 may be used as a path for delivering holes or electrons generated in the photoelectric conversion layer PD3. The second floating diffusion region FD2 may be provided in the substrate 100 and may be adjacent to the first surface 100a of the substrate 100. The second floating diffusion region FD2 may be electrically separated from the first floating diffusion region FD1 by a device insulating part 251. The device insulating part 251 may be formed by a shallow trench isolation (STI) technology and may have a thickness smaller than that of the device isolation pattern 200. Although not shown, the second transistors Sx', Rx', or Ax' of FIG. 5 and the transistors Sx, Rx, and Ax of FIG. 1 may be provided on the first surface 100a of the substrate 100. In some embodiments, the transistors Sx', Rx', and Ax' of FIG. 5 and the transistors Sx, Rx, and Ax of FIG. 1 may be operated in an independent manner. In some embodiments, at least some of the transistors may be shared by the photoelectric conversion layer PD3 and the photoelectric conversion regions PD1 and PD2.

The doping layer 150 may contain impurities different from those in the substrate 100, and thus, a depletion region may be formed between the doping layer 150 and the substrate 100. The third voltage V3 applied to the upper electrode pattern 620 may be transferred to the conductive pattern 220, and here, the third voltage V3 may be a positive voltage. In the case where the positive voltage is applied to the conductive pattern 220, a potential difference in the depletion region may be increased. Noise electrons may be trapped in the doping layer 150. In the case where the first voltage V1 is applied to the doping layer 150 through the first interconnection pattern 310, the trapped noises electron may be drained from the doping layer 150 to the first interconnection pattern 310.

Figure 7C:
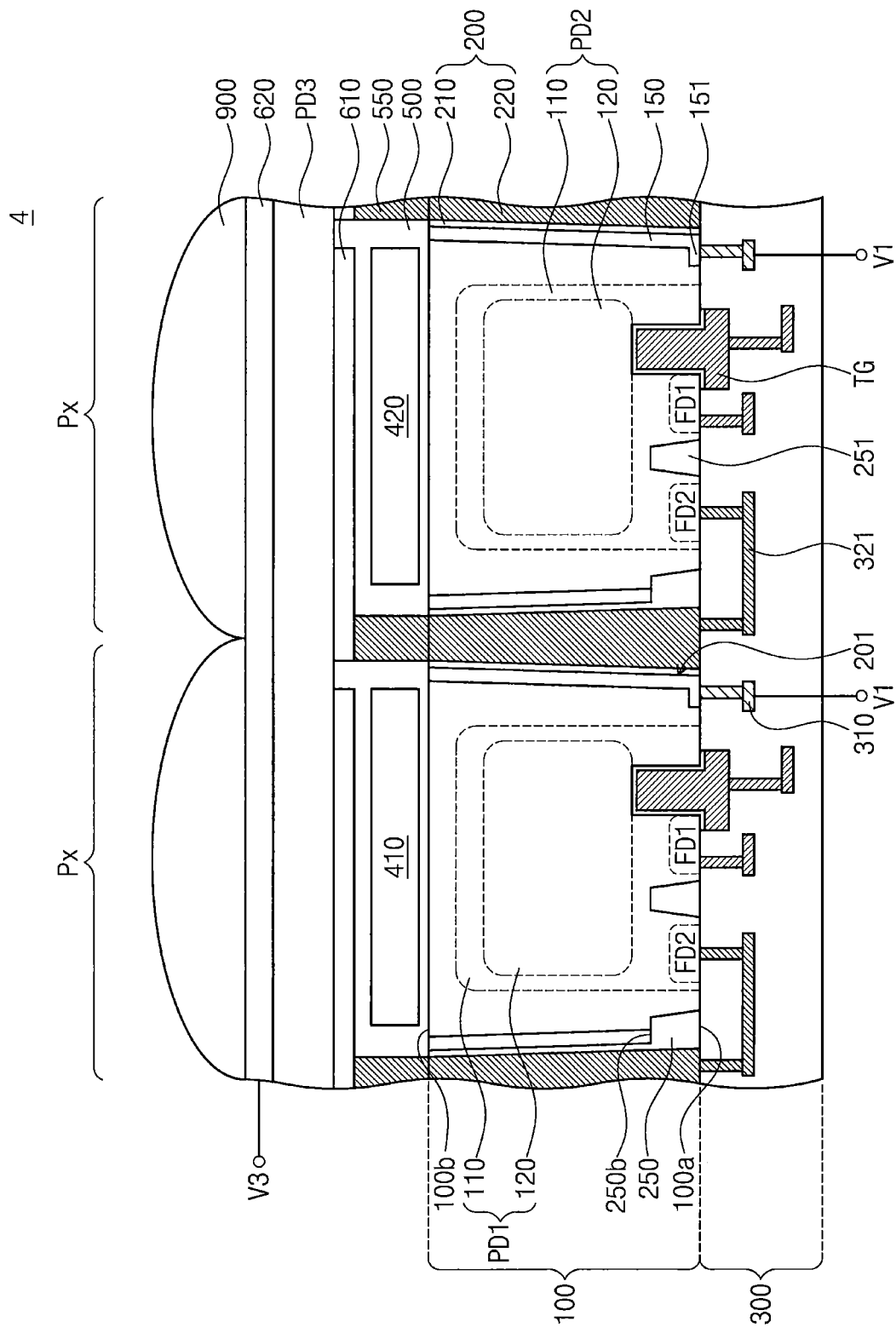
FIG. 7C is a sectional view illustrating a semiconductor device according to some embodiments of the inventive concept.

FIG. 7C is a sectional view illustrating a semiconductor device according to some embodiments of the inventive concept. For example, FIG. 7C is a sectional view taken along the line I'-II' of FIG. 7A. In the following description, a previously described element may be identified by a similar or identical reference number without repeating an overlapping description thereof, for the sake of brevity.

Referring to FIG. 7C, a semiconductor device 4 may include the substrate 100, the device isolation pattern 200, the doping layer 150, the photoelectric conversion regions PD1 and PD2, the photoelectric conversion layer PD3, the device insulating part 251, and the interconnection layer 300. The conductive pattern 220 may be electrically connected to the photoelectric conversion layer PD3 through the lower electrode pattern 610 and the connecting portion 550.

In some embodiments, the device insulating pattern 250 and the device isolation pattern 200 may form a stepwise structure as illustrated in FIG. 7C. The device insulating pattern 250 may be provided on the side surface of the device isolation pattern 200 and may be physically connected to the insulating pattern 210. For example, the device insulating pattern 250 may extend from the device isolation pattern 200 in a lateral direction parallel to the first surface 100a of the substrate 100. The top surface 250b of the device insulating pattern 250 may be closer to the first surface 100a of the substrate 100 than the top surface 200b of the device isolation pattern 200 is. In some embodiments, the device insulating pattern 250 and the device insulating part 251 may be formed by a single process (i.e., a same process). For example, the device insulating pattern 250 and the device insulating part 251 may be formed of or include the same material. The device insulating part 251 may be configured to have the same structure and function as that described with reference to FIG. 7B.

According to some embodiments of the inventive concept, a doping layer, whose conductivity type is different from that of a substrate, may be provided, and thus, a depletion region may be formed between the doping layer and the substrate. Noise electrons may be generated by interface defects between a device isolation pattern and the doping layer, but some of them may not pass through the depletion region and may be trapped in the doping layer. The device isolation pattern may include a conductive pattern applied with a positive voltage. More noise electrons may be trapped in the doping layer. The trapped noise electrons may be discharged to a first interconnection pattern. This may make it possible to prevent or suppress noise electrons from being moved into photoelectric conversion regions and consequently may improve an image quality of a semiconductor device.

While example embodiments of the inventive concepts have been particularly shown and described, it will be understood by one of ordinary skill in the art that variations in form and detail may be made therein without departing from the spirit and scope of the attached claims. The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a substrate;
   an insulative isolation pattern in the substrate, the insulative isolation pattern electrically isolating a first pixel and a second pixel from each other;
   a conductive pattern in the insulative isolation pattern;
   a doped layer on a side surface of the insulative isolation pattern;
   a photoelectric conversion layer that is on a first surface of the substrate and overlaps the first pixel and the second pixel; and
   color filters between the substrate and the photoelectric conversion layer,
   wherein the doped layer has a conductivity type different from that of the substrate.

2. The semiconductor device of claim 1, further comprising a first interconnection pattern on a second surface of the substrate and electrically connected to the doped layer.

3. The semiconductor device of claim 2, wherein the first interconnection pattern is connected to a voltage source that is configured to apply a positive voltage to the first interconnection pattern.

4. The semiconductor device of claim 1, further comprising a lower electrode pattern between the substrate and the photoelectric conversion layer,
   wherein the lower electrode pattern is electrically connected to the conductive pattern.

5. The semiconductor device of claim 1, further comprising:
   a floating diffusion region in the substrate; and
   a second interconnection pattern on a second surface of the substrate and electrically connects the conductive pattern to the floating diffusion region.

6. The semiconductor device of claim 1, wherein the doped layer directly contacts the substrate and the insulative isolation pattern.

7. The semiconductor device of claim 1, wherein the doped layer is an n-type doped layer.

8. The semiconductor device of claim 1, further comprising first and second photoelectric conversion regions in the first and second pixels, respectively, and in the substrate.

9. A semiconductor device comprising:
   a substrate of a first conductivity type, the substrate including a first surface and a second surface opposite the first surface;
   a device isolation pattern in the substrate, the device isolation pattern comprising a conductive pattern and an insulating pattern;
   a charge-trapping pattern on a side surface of the device isolation pattern, the charge-trapping pattern comprising impurities having a second conductivity type that is different from the first conductivity type;
   an organic photoelectric conversion layer on the first surface of the substrate; and
   a lower electrode pattern between the first surface of the substrate and a lower surface of the organic photoelectric conversion layer;
   an upper electrode pattern on an upper surface of the organic photoelectric conversion layer; and
   a second interconnection pattern on the second surface of the substrate and electrically connected to the lower electrode pattern through the conductive pattern,
   wherein the insulating pattern is between the conductive pattern and the charge-trapping pattern.

10. The semiconductor device of claim 9, further comprising a first interconnection pattern on the second surface of the substrate and electrically connected to the charge-trapping pattern.

11. The semiconductor device of claim 9, further comprising a floating diffusion region in the substrate,
    wherein the second interconnection pattern electrically connects the conductive pattern to the floating diffusion region.

12. The semiconductor device of claim 9, wherein the substrate comprises a first photoelectric conversion region and a second photoelectric conversion region, and
    wherein the organic photoelectric conversion layer is on the first photoelectric conversion region and the second photoelectric conversion region.

13. An image sensor comprising:
    first and second photoelectric conversion regions in a substrate;

a device isolation pattern between the first and second photoelectric conversion regions, the device isolation pattern comprising a conductive pattern and an insulating pattern between the conductive pattern and the substrate;

a doped region between the substrate and the device isolation pattern, the doped region directly contacting the insulating pattern;

a lower electrode pattern on a first surface of the substrate and electrically connected to the conductive pattern;

a photoelectric conversion layer on the lower electrode pattern;

a first interconnection pattern on a second surface of the substrate and electrically connected to the doped region; and a second interconnection pattern on the second surface of the substrate and electrically connected to the conductive pattern.

14. The image sensor of claim 13, wherein the substrate has a first conductivity type, and wherein the doped region has a second conductivity type different from the first conductivity type.

15. The image sensor of claim 13, wherein the first interconnection pattern electrically connects the doped region to a voltage source, and wherein the voltage source is configured to apply a ground voltage or a positive voltage to the first interconnection pattern.

16. The image sensor of claim 13, wherein the photoelectric conversion layer comprises a p-type organic semiconductor material and an n-type organic semiconductor material, and wherein the photoelectric conversion layer overlaps the first and second photoelectric conversion regions.

* * * * *